(12) United States Patent
Okuno (10) Patent No.: US 12,341,523 B2
(45) Date of Patent: Jun. 24, 2025

(54) DELAY CONTROL CIRCUIT, SEMICONDUCTOR MEMORY DEVICE, AND DELAY CONTROL METHOD

(71) Applicant: Winbond Electronics Corp., Taichung (TW)

(72) Inventor: Shinya Okuno, Yokohama (JP)

(73) Assignee: Winbond Electronics Corp., Taichung (TW)

( * ) Notice: Subject to any disclaimer, the term of this patent is extended or adjusted under 35 U.S.C. 154(b) by 174 days.

(21) Appl. No.: 18/347,935

(22) Filed: Jul. 6, 2023

(65) Prior Publication Data

US 2024/0014822 A1 Jan. 11, 2024

(30) Foreign Application Priority Data

Jul. 6, 2022 (JP) .................................. 2022-108875

(51) Int. Cl.
| | | |
|---|---|---|
| *H03L 7/081* | (2006.01) | |
| *G11C 11/4076* | (2006.01) | |
| *H03K 5/14* | (2014.01) | |

(52) U.S. Cl.
CPC ........ *H03L 7/0812* (2013.01); *G11C 11/4076* (2013.01); *H03K 5/14* (2013.01)

(58) Field of Classification Search
CPC ... H03L 7/0812; H03L 7/0814; H03L 7/0816; G11C 11/4076; G11C 11/40611; H03K 5/14; H03K 5/135
USPC ...................................................... 365/233.1
See application file for complete search history.

(56) References Cited

U.S. PATENT DOCUMENTS

| | | | |
|---|---|---|---|
| 6,369,627 B1 | 4/2002 | Tomita | |
| 7,777,542 B2* | 8/2010 | Ku ......... | H03L 7/0814 |
| | | | 327/158 |
| 8,368,444 B2 | 2/2013 | Trivedi et al. | |
| 2003/0002357 A1* | 1/2003 | Kwon .................... | H03K 5/131 |
| | | | 365/194 |
| 2007/0210841 A1* | 9/2007 | Kim ..................... | G11C 7/1072 |
| | | | 327/158 |

(Continued)

FOREIGN PATENT DOCUMENTS

| | | |
|---|---|---|
| CN | 105656461 B | 12/2018 |
| JP | 2015-35241 A | 2/2015 |
| TW | I469523 B | 1/2015 |

*Primary Examiner* — Fernando Hidalgo
(74) *Attorney, Agent, or Firm* — Birch, Stewart, Kolasch & Birch, LLP (57) ABSTRACT

Provided is a delay control circuit that can prevent an N-value detection sequence performed by the delay control circuit from exceeding a specific period. The delay control circuit includes: a DLL control circuit that sets a delay amount; a delay line circuit that performs a delay operation; and an N-value detection circuit that receives an input clock signal and an output clock signal and is configured to perform a pre-N-value detection operation. The pre-N-value detection operation includes detecting the number of delayed clock cycles from the input clock signal to the output clock signal as the number of pre-delayed clock cycles before a delay operation is performed. In response to that the number of pre-delayed clock cycles is not greater than a specific value, the DLL control circuit changes the delay amount so that the delay line circuit performs the delay operation in a fast mode.

20 Claims, 9 Drawing Sheets

(56) References Cited

U.S. PATENT DOCUMENTS

2008/0130384 A1* 6/2008 Choi ................ H03L 7/0816
327/158

* cited by examiner

DELAY CONTROL CIRCUIT, SEMICONDUCTOR MEMORY DEVICE, AND DELAY CONTROL METHOD

CROSS REFERENCE TO RELATED APPLICATIONS

This application claims priority of Japan Patent Application 2022-108875, filed on Jul. 6, 2022, the entirety of which is incorporated by reference herein.

BACKGROUND OF THE INVENTION

Field of the Invention

The present invention relates to a signal delay technology, and in particular relates to a delay control circuit, a semiconductor memory device, and a delay control method suitable for a delay-locked loop circuit.

Description of the Related Art

A dynamic random access memory (DRAM) is a semiconductor memory device that stores information by storing charges in capacitors. As a volatile memory device, the information stored in DRAM will be lost when no power is supplied. In a conventional DRAM, such as Japan Patent Publication No. 2015-35241, a delay locked loop (DLL) circuit is provided as a phase synchronization circuit. The DRAM uses the delay locked loop circuit to generate an internal clock signal so that the output of data signals is synchronized with an external clock signal.

In a conventional DRAM, in order to utilize a DLL circuit to adjust delay of clock pulses, a reset operation of the DLL circuit, a delay operation of the DLL circuit (such as the operation that makes each delay line active and, at the same time, synchronizes the external clock with the internal clock), and a detection operation of an N-value used to represent the number of delayed clock cycles between the input clock signal and the internal clock signal are performed.

Here, the locking time Td11 caused by the delay operation of the DLL circuit can be expressed by the following formula:

$$Tint + Td11 = N \times tCK$$

In the above formula, Tint represents the existing delay time in the DDL circuit, tCK represents the clock cycle, and Td11 represents the locking time. For example, when the temperature in the semiconductor memory device causes the clock cycle (tCK) to be longer than the existing delay time (Tint), as shown in the above formula, the locking time (Td11) is also extended due to the delay operation of the DLL circuit. If the locking time is extended, the overall execution time of the delay operation will become longer, which may delay the execution time of the next operation or exceed the scheduled execution time tDLLK of the DLL circuit.

BRIEF SUMMARY OF THE INVENTION

In view of the above problems, the present invention provides a delay control circuit, a semiconductor memory device, and a delay control method, which can prevent an N-value detection sequence performed by the delay control circuit from exceeding a specific period so as to avoid misoperation.

In an embodiment, the present invention provides a delay control circuit for generating a delayed signal as an output clock signal according to an input clock signal. The delay control circuit comprises an N-value detection circuit, a DLL control circuit, and a delay line circuit. The N-value detection circuit receives the input clock signal and the output clock signal and is configured to perform a pre-N-value detection operation. The pre-N-value detection operation comprises detecting the number of delayed clock cycles from the input clock signal to the output clock signal as the number of pre-delayed clock cycles before a delay operation is performed. The DLL control circuit is configured to set a delay amount according to a phase difference between the input clock signal and the output clock signal and the number of pre-delayed clock cycles and output a control signal representing the delay amount. The delay line circuit is configured to receive the control signal and perform the delay operation according to the control signal. The delay operation comprises delaying the input clock signal based on the delay amount and generating the output clock signal so that the input clock signal and the output clock signal are synchronous. In response to that the number of pre-delayed clock cycles is not greater than a specific value, the DLL control circuit is configured to change the delay amount so that the delay line circuit performs the delay operation in a fast mode. In response to that the number of pre-delayed clock cycles is greater than the specific value, the delay line circuit performs the delay operation in a normal mode. The delay amount for the normal mode is different from the delay amount for the fast mode.

In an embodiment, the present invention provides a semiconductor memory device comprising the delay control circuit, a memory cell array, an input buffer configured to provide the input clock signal, and an output buffer coupled to an output of the delay line circuit.

In an embodiment, the present invention provides a delay control method comprising the following steps. A pre-N-value detection operation is performed, wherein the pre-N-value detection operation comprises detecting the number of delayed clock cycles from the input clock signal to the output clock signal as the number of pre-delayed clock cycles before a delay operation is performed. A delay amount is set by a DLL control circuit according to a phase difference between the input clock signal and the output clock signal and the number of pre-delayed clock cycles. A control signal representing the delay amount is output by the DLL control circuit. The delay operation is performed by a delay line circuit according to the control signal, wherein the delay operation comprises delaying the input clock signal based on the delay amount and generating the output clock signal so that the input clock signal and the output clock signal are synchronous. Wherein in response to that the number of pre-delayed clock cycles is not greater than a specific value, the delay amount is changed so that the delay line circuit performs the delay operation in a fast mode; wherein in response to that the number of pre-delayed clock cycles is greater than the specific value, the delay line circuit performs the delay operation in a normal mode. The delay amount for the normal mode is different from the delay amount for the fast mode.

According to the delay control circuit, the delay control method, and the semiconductor memory device provided by the present invention, before the delay operation is performed, the N-value detection circuit detects the number of pre-delayed clock cycles that indicates a possibility of whether the delay operation will be extended. Next, when the number of pre-delayed clock cycles is not greater than a specific value, since the delay operation is predicted to be extended, the DLL control circuit changes the delay amount (for example, the DLL control circuit increases the variation rate for the delay amount) thereby preventing the N-value detection sequence performed by the delay control circuit from exceeding a specific period, so as to avoid misoperation.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Hereinafter, a delay control circuit, a semiconductor memory device, and a delay control method according to the embodiments of the present invention will be described in detail with reference to the accompanying drawings. However, these embodiments are examples, and the present invention is not limited thereto.

In addition, the descriptions of "first". "second", and "third" in the specification are used to distinguish one certain constituent element from other constituent elements, and are not used to limit the number of constituent elements, sequence, or priority etc. For example, when there are descriptions of the "first element" and the "second element", it does not mean that only two elements called "first element" and "second element" are used, further does not mean that the "first element" must precede the "second element".

Figure 1:
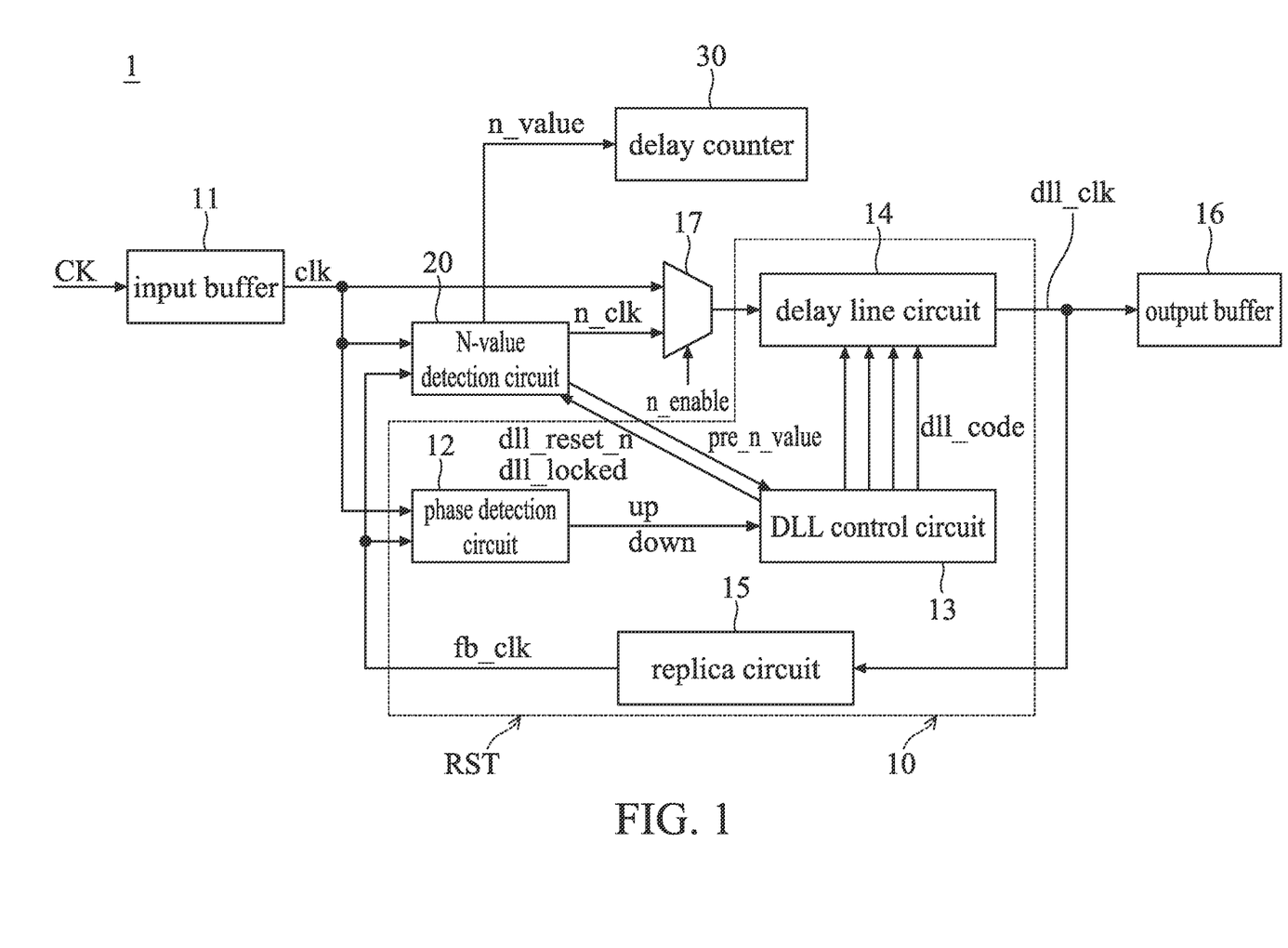
FIG. 1 is a schematic block diagram of a delay control circuit according to an embodiment of the present invention.

As shown in FIG. 1, in the embodiment, a semiconductor memory device 1 comprises an input buffer 11, a delay control circuit, and an output buffer 16. The delay control circuit comprises a delay locked loop (DLL) circuit 10, an N-value detection circuit 20, and a delay counter 30.

In addition, in order to simplify the description, in the embodiment, except for the input buffer 11 and the output buffer 16, the semiconductor memory device 1 has other conventional structures such as an command decoder, a memory cell array, and an input/output interface circuit.

The DLL circuit 10 comprises a phase detection circuit 12, a DLL control circuit 13, a delay line circuit 14, and a replica circuit 15. In one embodiment, the replica circuit 15 is a replica of the output buffer 16 that is coupled to the output of the delay line circuit 14.

The input buffer 11 is configured to buffer an external clock signal CK that is input to the input buffer 11 and to generate an input clock signal clk. The input clock signal clk can be sent to the delay line circuit 14, the N-value detection circuit 20 and the phase detection circuit 12 through a multiplexer 17. The delay line circuit 14 delays the input clock signal clk to generate a delayed signal d11_clk and transmits the delayed signal d11_clk to the output buffer 16 and the replica circuit 15. The replica circuit 15 takes the delayed signal d11_clk generated by the delay line circuit 14 as a feedback signal fb_clk and then outputs the feedback signal fb_clk to the N-value detection circuit 20 and the phase detection circuit 12. The DLL circuit 10 takes the delayed signal d11_clk as an output clock signal and provides the delayed signal d11_clk to the output buffer 16 to control the output of the data by the output buffer 16.

The phase detection circuit 12 is configured to detect the phase difference between the input clock signal cAk and the feedback signal fb_clk. When the input clock signal clk is input to the phase detection circuit 12, the feedback signal fb_clk is also input. The phase detection circuit 12 generates a phase signal up/down, which is used to indicate that the feedback signal fb_clk is advanced or delayed relative to the input clock signal clk. The phase signal up/down is provided to the DLL control circuit 13.

The DLL control circuit 13 determines a delay amount according to the phase difference detected by the phase detection circuit 12. Specifically, the DLL control circuit 13 sets the increase rate (an example of the "change rate" in the present application) for the delay amount in the DLL locking operation (an example of the "delay operation" in the present application) according to the phase signal up/down from the phase detection circuit 12 and a pre-N-value signal pre_n_value from the N-value detection circuit 20 described in detail later and determines the delay amount according to the set increase rate. Next, the DLL control circuit 13 generates and outputs a control signal d11_code used to indicate the delay amount during the DLL locking operation. The control signal d11_code may be composed of a plurality of bits. The delay line circuit 14 receives the control signal d11_code output by the DLL control circuit 13.

The delay line circuit 14 is configured as a variable delay circuit for performing the DLL locking operation. Each time the DLL control circuit 13 sets the delay amount, the delay line circuit 14 delays the input clock signal clk based on the delay amount and generates the delayed signal d11_clk. Specifically, the delay line circuit 14 activates the internal delay lines according to the control signal d11_code to delay the input clock signal clk and generate the delayed signal d11_clk. The details will be described later.

When the DLL circuit 10 receives a reset signal RST (also called as a start signal of the DLL locking operation) and the DLL circuit enters a DLL reset state, the DLL control circuit 13 generates and provides a control signal dll_reset_n with a high level to the N-value detection circuit 20. According to the received control signal dll_reset_n with the high level, the N-value detection circuit 20 performs an N-value detection operation described later (an example of the "pre-detection operation" in the present invention).

In addition, when the phase difference indicated by the phase signal up/down converges to a specific range (that is, the input clock signal clk is synchronous or almost synchronous with the feedback signal fb_clk corresponding to the delayed signal dll_clk), the DLL control circuit 13 determines that the DLL locking operation ends so that a control signal dll_locked, which is used to indicate that the input clock signal clk is synchronized with the feedback signal fb_clk, is switched to a high level and provided to the N-value detection circuit 20. By receiving the control signal dll_locked with the high level, the N-value detection circuit 20 performs the N-value detection operation described later (an example of the "detection operation" in the present invention).

The N-value detection circuit 20 performs a pre-N-value detection operation and the N-value detection operation. In detail, the N-value detection circuit 20 detects a pre-N value according to the input clock signal clk and the feedback signal fb_clk during the pre-N-value detection operation and detects an N value according to the input clock signal clk and the feedback signal fb_clk during the N-value detection operation.

Here, the N value can be obtained by dividing the sum of Td11 (the locking time of the DLL circuit) and Tint (the inherent delay time in the DLL circuit) by tCK (the clock cycle). The N value represents the number of delayed clock cycles from the input clock signal clk to the output clock signal in the delay operation of the DLL circuit 10 (thus, the N value is a positive integer).

Specifically, when the N-value detection circuit 20 receives the effective (high level) control signal dll_locked used to indicate the end of the DLL locking operation, the N-value detection circuit 20 is configured to perform the N-value detection operation, that is, to detect the number of delayed clock cycles from the input clock signal cik to the feedback signal fb_cik as the N value and provides an N-value signal n_value representing the detected N value to the delay counter 30. In addition, in the embodiment, the step performed from the time when the reset signal RST is input to the DLL circuit 10 to the time when the N-value detection operation ends is referred to as "N-value detection sequence".

In addition, when the N-value detection circuit 20 receives the high-level control signal dll_reset_n that indicates that the reset signal RST is input to the DLL circuit 10, the N-value detection circuit 20 is configured to perform the pre-N-value detection operation, that is, to detect the number of delayed clock cycles from the clock signal clk to the feedback signal fb_clk at this time as the pre-N value (an example of "the number of pre-delayed clock cycles" in the present invention). Then the N-value detection circuit 20 provides the detected pre-N value to the DLL control circuit 13. That is, the pre-N-value detection operation represents the operation of detecting a pseudo N value before the DLL locking operation, that is, in the state where there is actually no delay time (the state where the locking time Td11 is 0).

The N value may be equal to the pre-N value when the locking time Td11 is short. However, generally, the difference between the N value and the pre-N value is about "1". Therefore, the case where the pre-N value is not greater than a specific value (the specific value is 1 in the embodiment) can indicate that the locking time TdOI may be extended. That is, in the embodiment, by detecting the pre-N value before the DLL locking operation, it can be predicted whether the locking time Td11 is longer than an expected time. Next, the DLL circuit 10 of the embodiment can perform the DLL locking operation in a fast mode in the case where the locking time Td11 is predicted to be extended. The fast mode ends the DLL locking operation in a shorter time than the execution time of the DDL locking operation in the normal mode.

Figure 3A:
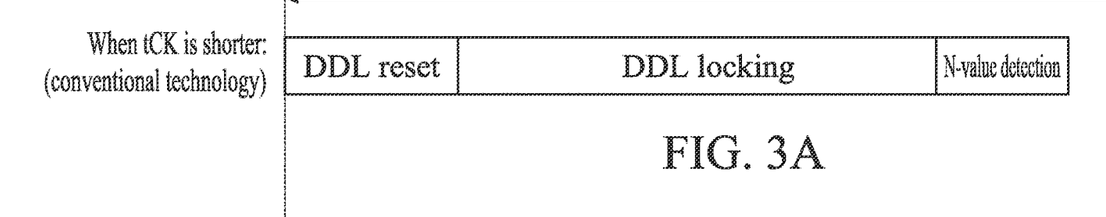
FIGS. 3A, 3B, 3C, and 3D are schematic diagrams showing difference between a conventional technology and an embodiment of the present invention in an N-value detection sequence and the impact on the time required for DLL locking when a clock cycle changes.
Figure 3B:
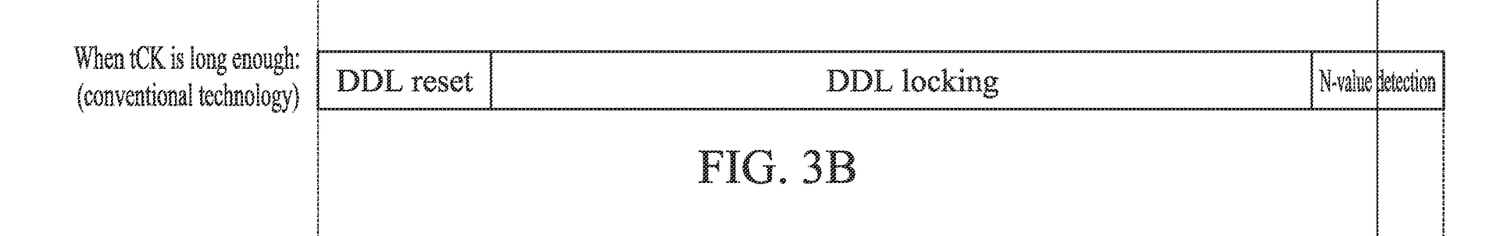

In the conventional technology, as shown in FIG. 3A, when the clock cycle tCK is shorter than the inherent delay time Tint, the required time from the DLL reset to the end of N-value detection is shorter than a specific period tDLLK (for example, 512 clock cycles) because the locking time Td11 is not extended. However, as shown in FIG. 3B, when the clock cycle tCK is much greater than the inherent delay time Tint, resulting in a significant extension of the locking time Td11, the required time from the DLL reset to the end of N-value detection will be longer than the specific period tDLLK, thereby resulting an operating error.

Figure 2B:
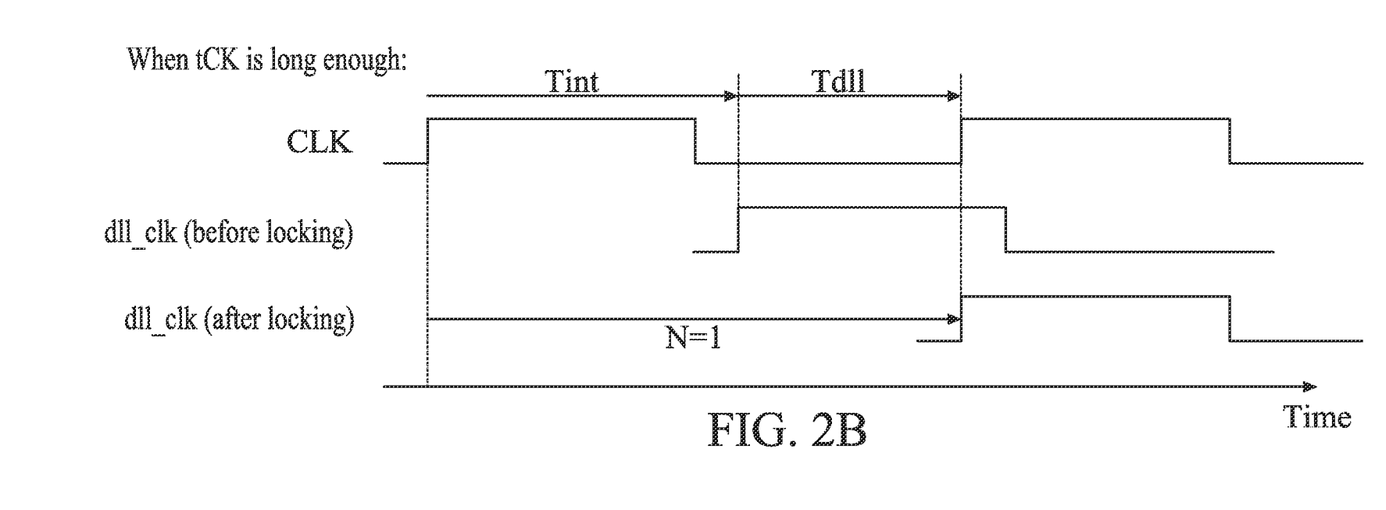
Figure 3C:
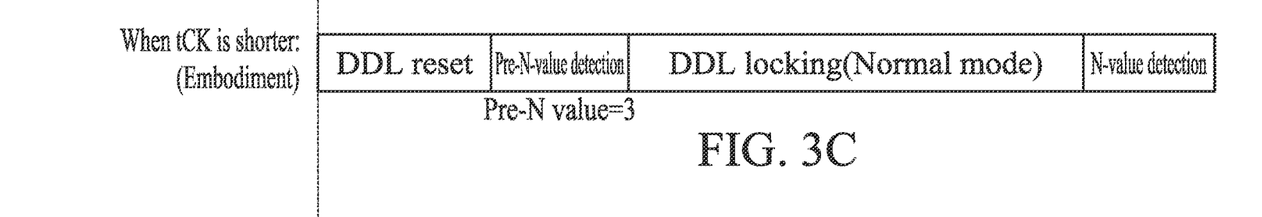
Figure 3D:
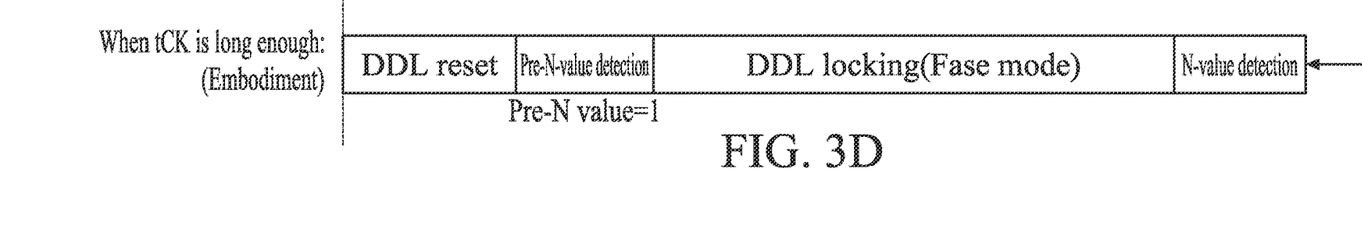

In order to solve the above problem, in the embodiment, the pre-N-value detection operation is performed to detect the pre-N-value (that is, to predict whether the DLL locking operation is likely to be extended) before the DLL locking operation is performed. When it is detected that the pre-N value is not greater than 1, it is determined that the DLL locking operation is likely to be extended, and then the DLL locking operation is shortened, thereby preventing the time required to perform the N-value detection sequence from exceeding the specific period tDLLK. That is, as shown in FIG. 2B, when the clock cycle tCK is much greater than the inherent delay time Tint, resulting in a significant extension of the locking time Td11, the pre-N value detected by the N-value detection circuit 20 is not greater than 1. At this time, if the DLL locking operation is performed according to the normal increase rate of the delay amount (that is, the DLL locking operation is performed in the normal mode), there is a possibility that the N-value detection sequence exceeds the specific period tDLLK. Therefore, in the embodiment, as shown in FIG. 3D, when the pre-N value detected by the N-value detection circuit 20 is not greater than 1, the DLL circuit 10 can perform the DLL locking operation in the fast mode by setting the increase rate of the delay amount higher than that in the normal mode so that the N-value detection sequence can be completed within the specific period tDLLK.

Figure 2A:
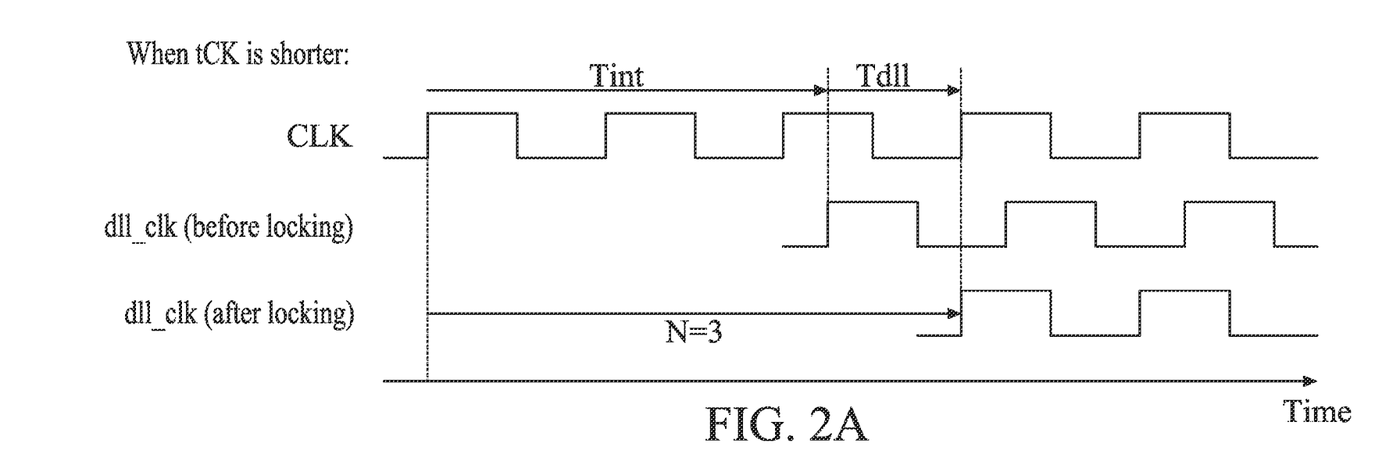
FIGS. 2A and 2B are schematic diagrams showing influence on a locking time when a clock cycle changes.

In addition, as shown in FIG. 2A, when the clock cycle tCK is shorter than the inherent delay time Tint, the pre-N value detected by the N-value detection circuit 20 is greater than 1. Accordingly, the DLL circuit 10 will determine that the possibility of extension of the locking time is low. As shown in FIG. 3C, the DLL circuit 10 performs the DLL locking operation in the normal mode. The increase rate of the delay amount in the normal mode is smaller than the increase rate of the delay amount in the fast mode. In the embodiment, since the time required for the pre-N-value detection operation is less than the time required for the DLL locking operation, even if the pre-N-value detection operation is added to the N-value detection sequence, the time required for the N-value detection sequence can be prevented from exceeding the specific period tDLLK.

Hereinafter, the configuration of the N-value detection circuit 20 according to an embodiment of the present invention will be described with reference to FIG. 4.

The N-value detection circuit 20 of the embodiment comprises an n_clk signal generation circuit 21 and an N-value counting circuit 22. The n_clk signal generation circuit 21 comprises a first one-shot circuit 211, a second one-shot circuit 212, a third one-shot circuit 213, a NOR circuit 214, a flip-flop circuit 215, a first latch circuit 216, and a first AND circuit 217. The N-value counting circuit 22 comprises two D-type flip-flop (D-FF) circuits 221 and 222, a second AND circuit 223, a second latch circuit 224, a third AND circuit 225, and a 4-bit counter 226.

The n_clk signal generation circuit 21 generates a signal n_clk corresponding to the input clock signal clk during the pre-N-value or the N-value detection operation. In the n_clk signal generation circuit 21, the control signal d11_locked is input to the first one-shot circuit 211, the control signal d11_reset_n is input to the second one-shot circuit 212, and the control signal d11_locked and the control signal d11_reset_n are provided to the input terminals of the NOR circuit 214 respectively through the first one-shot circuit 211 and the second one-shot circuit 212. Next, the signal that is output from the NOR circuit 214 and the signal that is generated by inputting a signal n_end to the third one-shot circuit 213 are input to the flip-flop circuit 215 to generate a control signal n_enable. The case where the control signal n_enable is at a high level indicates that the pre-N-value or N-value detection operation can be performed. The control signal n_enable generated by the flip-flop circuit 215 is provided to the first latch circuit 216. Moreover, the input clock signal clk is input to the first latch circuit 216 as a clock signal. The signal output from the first latch circuit 216 is input to the first AND circuit 217 simultaneously with the input clock signal cAk so that the signal n_clk is output from the first AND circuit 217.

The N-value counting circuit 22 counts the number of clock cycles of the input clock signal clk from the time when the input clock signal clk is input to the time when the feedback signal fb_clk is generated during the pre-N-value or the N-value detection operation to detect the pre-N value or N value. In the N-value counting circuit 22, the signal n_clk and the control signal n_enable are provided to the first D-FF circuit 211 to generate a signal n_start. In addition, the feedback signal fb_clk that corresponds to the delayed signal d11_clk and the control signal n_enable are provided to the second D-FF circuit 212 to generate the signal n_end. Next, the signal n_start and the signal n_end are input to the second AND circuit 223 to generate a signal n_detection. The second latch circuit 224 receives the signal n_detection and the signal n_clk that serves as a clock signal. The output from the second latch circuit 224 and the signal n_clk are input to the third AND circuit 225. The third AND circuit 225 outputs a signal count_clk for the counting of the pre-N value or the N value. The signal count_clk is provided to the 4-bit counter 226.

The 4-bit counter 226 is configured to count pulses of the signal count_clk and detect the pre-N value or the N value and output the N-value signal n_value representing the detected pre-N value or N value. The N-value signal n_value is provided to the DLL control circuit 13 as the pre-N-value signal pre_n_value w % bile being provided to the delay counter 30. In addition, the 4-bit counter 226 can also be configured to reset the N value to an initial value (for example, 0) to restart counting when the control signal d11_reset_n or the control signal d11_locked is input at a high level.

In this way, when the control signal d11_reset_n or the control signal d11_locked is at the high level, the N-value counting circuit 22 performs the pre-N-value detection operation or the N-value detection operation by counting the number of clock cycles (the number of pulses) of the signal count_clk from the time when the signal n_clk corresponding to the input clock signal clk is input to the time when the feedback signal fb_clk corresponding to the delayed signal d11_clk as the number of delayed clock cycles.

Returning to FIG. 1, the DLL control circuit 13 and the delay line circuit 14 will be described in detail. The multiplexer 17 selects one of the signal n_clk and the input clock signal clk as an output according to the control signal n_enable. Specifically, when the multiplexer 17 receives the high-level control signal n_enable (that is, when the pre-N-value detection operation or the N-value detection operation is performed), the signal n_clk is provided to the input terminal of the delay line circuit 14. When the multiplexer 17 receives the low-level control signal n_enable, it provides the input clock signal clk to the delay line circuit 14. The input delay line circuit 14 delays the input clock signal clk based on the delaying of the control signal d11_code from the DLL control circuit 13 to generate the delayed signal d11_clk.

In the embodiment, the DLL control circuit 13 sets the increase rate for the delay amount during the DLL locking operation according to the pre-N-value signal pre_n_value that is output from the N-value detection circuit 20 and determines the delay amount based on the set increase rate. Next, the DLL control circuit 13 generates the control signal d11_code that is used to control the delay line circuit 14 according to the determined delay amount. Specifically, w % ben the pre-N value detected by the pre-N-value detection operation is greater than 1, the DLL control circuit 13 performs the DLL locking operation in the normal mode, that is, the control signal d11_code is generated based on a relatively low increase rate of the delay amount. On the other hand, when the pre-N-value detected by the pre-N-value detection operation is not greater than 1, the DLL control circuit 13 generates the control signal d11_code that is used to control the delay line circuit 14 according to a relatively high increase rate of the delay amount for performing the DLL locking operation in the fast mode Here, in the present embodiment, the increase rate of the delay amount represents the increased number of activated delay lines in the delay line circuit 14 each time the control signal d11_code is input. For example, if one delay line is activated based on the input of the initial control signal d11_code, when two delay lines are activated in response to the input of the next control signal d11_code, the increase rate is "1". For another example, if one delay line is activated based on the input of the initial control signal d11_code, when three delay lines are activated in response to the input of the next control signal d11_code, the increase rate is "2". In addition, the increase rate is not limited to represent the increased number of activated delay lines that is counted from the last time the control signal d11_code is input to this time the control signal d11_code is input. In other embodiments, a value that represents the ratio of the increase in the delay amount in each specific time period can serve as the increase rate.

When the number of high-level bits in the control signal d11_code increases (that is, more delay lines are activated), the delay line circuit 14 makes the delay time of the delayed signal d11_clk corresponding to the input clock signal clk longer. In the fast mode, since the number of high-level bits in the control signal d11_code increases at a high increase rate, the number of activated delay lines in the delay line circuit 14 increases in a short time. Therefore, the delay of the delayed signal is achieved earlier, and the locking time Td11 is shortened. In this way, the delay line circuit 14 delays the input clock signal clk according to the control signal d11_code to generate a delayed signal d11_clk and outputs it to the output buffer 16 and the replica circuit 15 as mentioned above.

The delay counter 30 is configured to count delays in synchronization with the internal clock signal (the delayed signal d11_clk) generated by the DLL circuit 10. In addition, after the specific period tDLLK has elapsed, the delay counter 30 performs the delay counting by using the N-value signal n_value that is detected by the N-value detection circuit 20 to represent the N value. For example, in the case wherein a column address strobe (CAS) is delayed, the set delay indicates the number of clock cycles in the period from the time when a command (for example, a read command) is input to a semiconductor memory device (here, DRAM) to the time when data (for example, read data) is output from the semiconductor memory device. At this time, when the reset signal RST is input to the DLL circuit 10, the delay counter 30 counts the delay by subtracting the N value from the value of the CAS delay, for example, set in the mode register (not shown in the figures). For example, when the value of the CAS delay is 10 and the N value is 5, the delay counter 30 performs a subtraction operation on these two values and uses the subtraction result (5 clock cycles) as the counting result of the delay.

Figure 4:
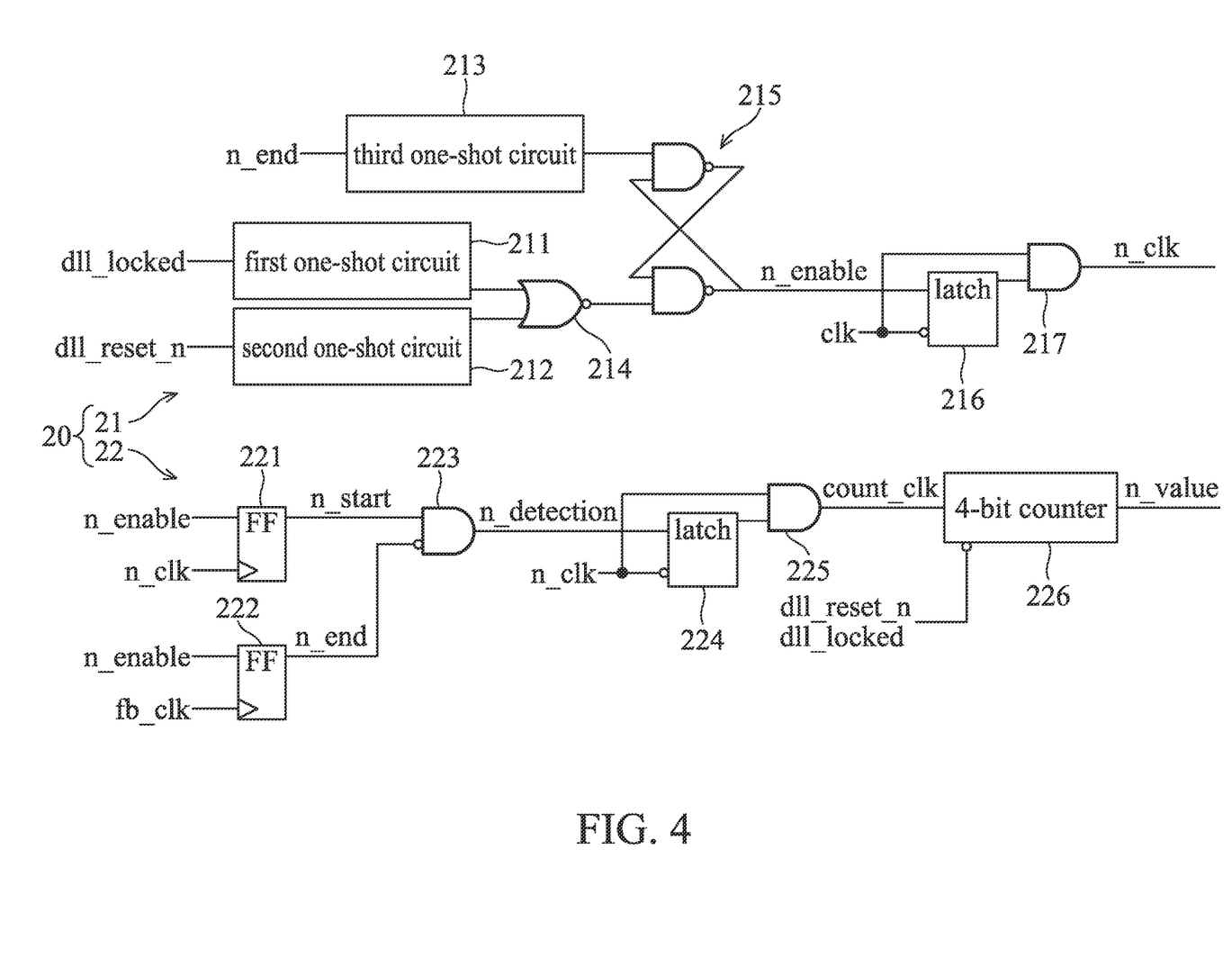
FIG. 4 is a schematic diagram showing a configuration example of an N-value detection circuit according to an embodiment of the present invention.
Figure 5:
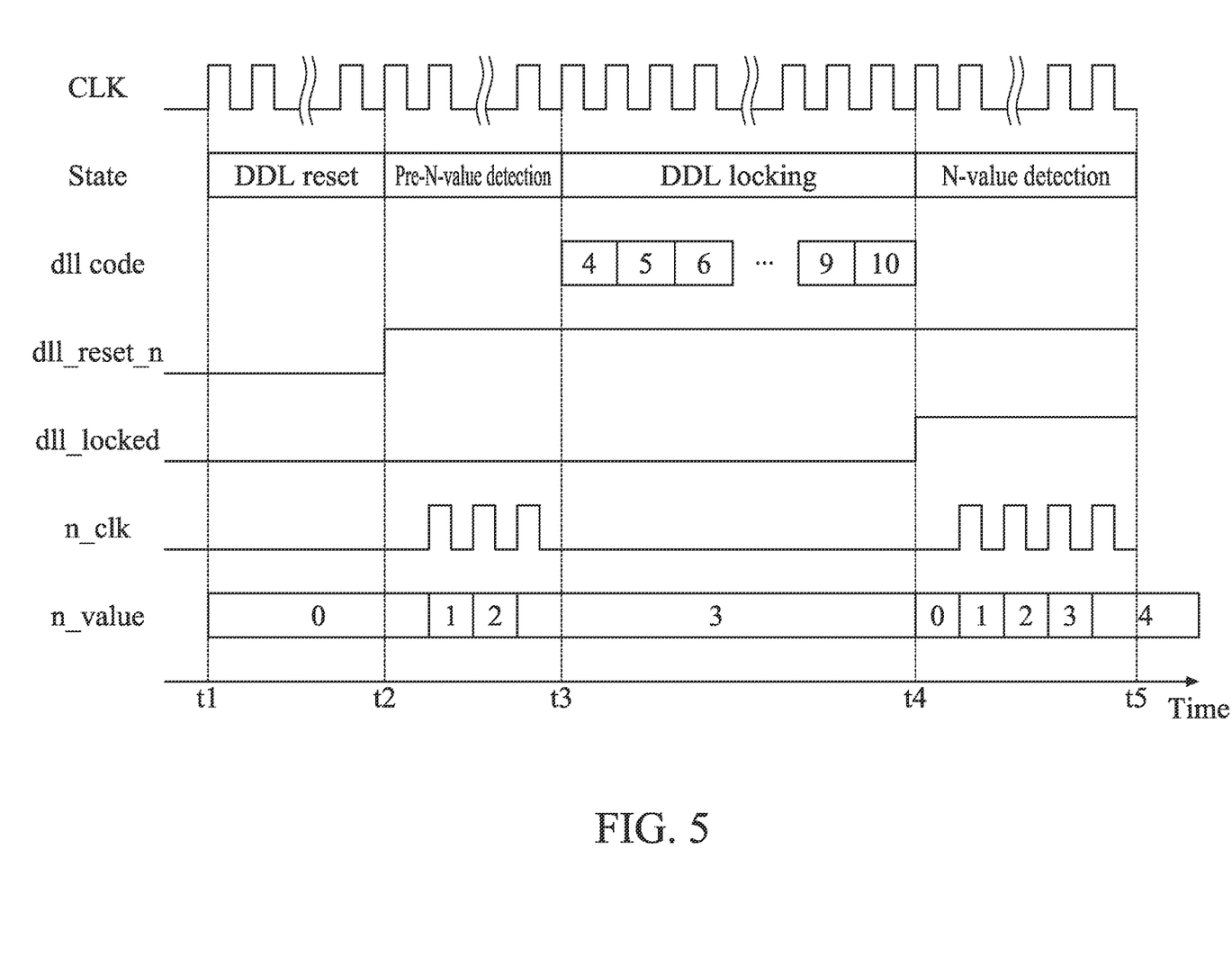
FIG. 5 is a timing diagram showing voltage transitions of related signals when a delay control circuit performs a locking operation in a normal mode according to an embodiment of the present invention.
Figure 6:
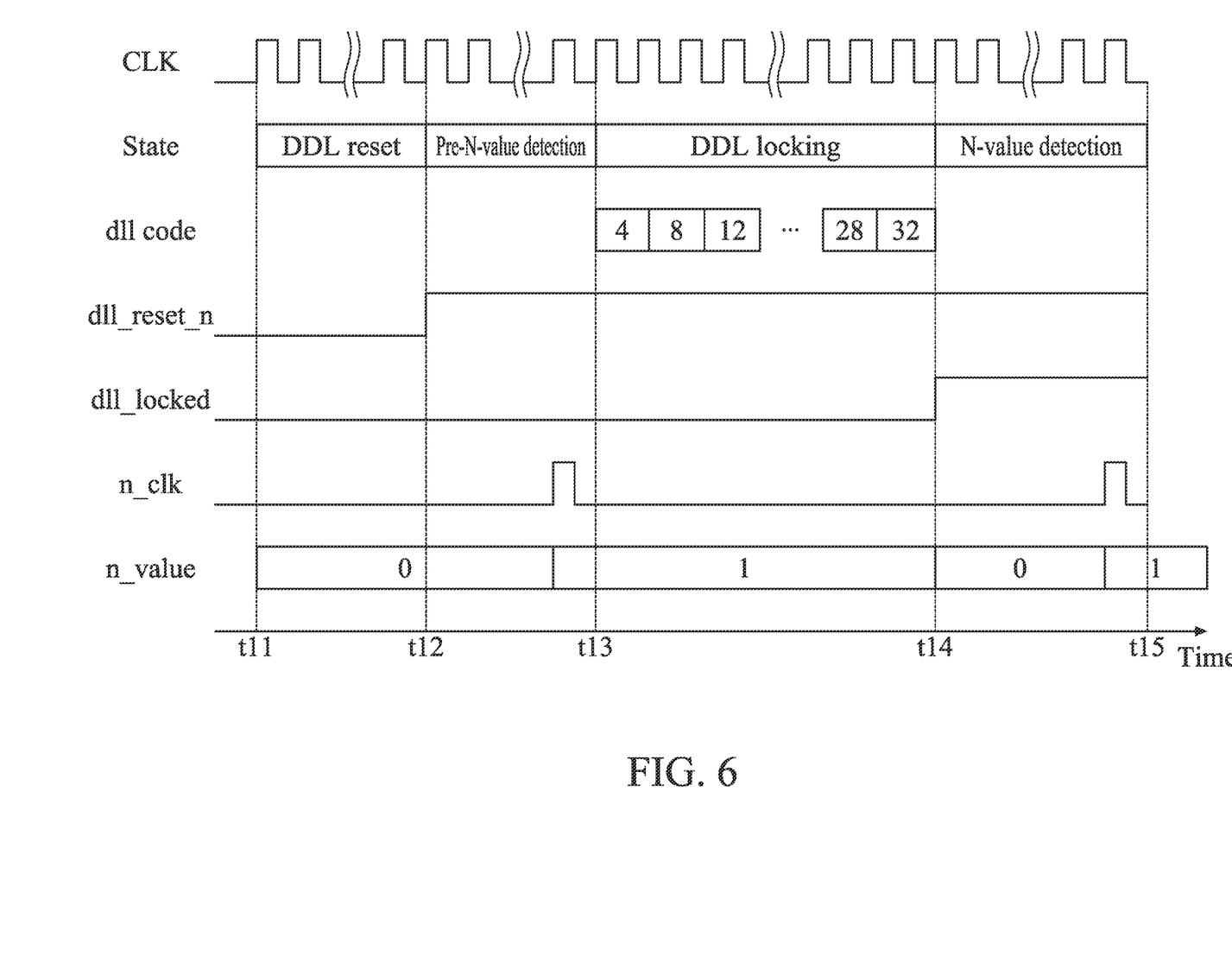
FIG. 6 is a timing diagram showing voltage transitions of related signals when a delay control circuit performs a locking operation in fast mode according to an embodiment of the present invention.

The timing diagrams shown in FIG. 5 and FIG. 6 are used in combination with FIG. 1 and FIG. 4 to illustrate the delay control method of the embodiment. First, the delay control procedure when the DLL circuit 10 performs the DLL locking operation in the normal mode will be described with reference to FIG. 5.

At time t1, the reset signal RST is input to the DLL circuit 10, and, thus, the DLL circuit 10 enters a reset state. At time t2, the DLL control circuit 13 inputs the control signal d11_reset_n with the high level to the N-value detection circuit 20. Therefore, the N-value detection circuit 20 starts to perform the pre-N-value detection operation.

During the pre-N-value detection period (that is, the period from the time t2 to the time 3), first, the control signal d11_locked with the low level is input to the first one-shot circuit 211 of the n_clk signal generation circuit 21, and the control signal d11_reset_n with the high level is input to the second one-shot circuit 212. The output signals of the first one-shot circuit 211 and the second one-shot circuit 212 are input to the NOR circuit 214, and the output of the NOR circuit 214 is provided to the flip-flop circuit 215. In addition, the signal n_end with the low level is input to the third one-shot circuit 213, and the output signal of the third one-shot circuit 213 is also input to the flip-flop circuit 215. The control signal n_enable output from the flip-flop circuit 215 is generated at the high level. The control signal n_enable that is generated at the high level and the input clock signal clk are input to the first latch circuit 216. The signal that is generated by the first latch circuit 216 and the input clock signal clk are input to the first AND circuit 217. The first AND circuit 217 generates the signal n_clk that is generated only in the pre-N-value detection operation or the N-value detection operation, and the signal n_clk is a clock signal.

In the N-value counting circuit 22, when the control signal n_enable with the high level is input to the first D-type flip-flop 221, the first D-type flip-flop 221 generates the signal n_start with the high level according to the received signal n_clk. On the other hand, when the feedback signal fb_clk is input to the second D-type flip-flop 222, the signal n_end with the low level is generated. Next, the high-level signal n_start and the low-level signal n_end are input to the second AND circuit 223, and the second AND circuit 223 generates the signal n_detection with the high level accordingly. The second latch circuit 224 receives the high-level signal n_detection and the signal n_clk, and the output from the second latch circuit 224 and the signal n_clk are input to the third AND circuit 225. Accordingly, the signal count_clk serving as a signal for the counting of the pre-N value or the N value is output. The signal count_clk is input to the 4-bit counter 226.

The 4-bit counter 226 is configured to increase the value of the N-value signal n_value each time a pulse of the signal count_clk is input and output the N-value signal n_value. In this way, a counting-up operation is performed on the value of the N-value signal n_value in response to the signal n_clk. The N-value signal n_value generated by the 4-bit counter 226 is input to the delay counter 30 and simultaneously input to the DLL control circuit 13 as the pre-N-value signal. According to the above description, the N-value counting circuit 22 can perform the counting-up operation on the value of the N-value signal n_value in response to the signal n_clk until the time t3. In the embodiment of FIG. 5, the value of the N-value signal n_value that is used to represent the pre-N value is counted up to "3" until time t3.

In this way, during the pre-N-value detection period, the N-value detection circuit 20 can detect the number of pulses of the generated signal n_clk as the number of pre-delayed clock cycles (i.e., the pre-N value).

At time t3, the second D-type flip-flop 222 of the N-value counting circuit 22 receives the feedback signal fb_clk to generate the signal n_end with the high level. In addition, in response to the signal n_end becoming the high level, the n_clk signal generation circuit 21 generates the control signal n_enable with the low level and the signal n_clk with the low level. Furthermore, in response to the signal n_end becoming the high level, the N-value counting circuit 22 generates the signal n_detection with the low level and the signal count_clk with the low level. Accordingly, the pre-N-value detection operation ends.

The DLL locking operation starts at time t3. At this time, the DLL circuit 10 transitions to the DLL locking state. The phase detection circuit 12 receives the input clock signal cAk and the feedback signal fb_clk for the phase detection and transmits the detected phase signal up/down to the DLL control circuit 13. On the other hand, since the control signal n_enable is generated at the low level, the multiplexer 17 selects the input clock signal clk as the output.

The DLL control circuit 13 sets the increase rate for the delay amount based on the phase signal up/down and the pre-N-value signal pre_n_value and determines the delay amount based on the set increase rate. In the embodiment, since the detected pre-N-value signal pre_n_value is greater than 1 (for example, 3), the DLL control circuit 13 performs the DLL locking operation in the normal mode. In the embodiment, when the DLL locking operation is performed in the normal mode, the increased number of activated delay lines in the delay line circuit 14 is 1, however, the present invention is not limited thereto. At this time, the DLL control circuit 13 generates the control signal d11_code that indicates the delay amount determined based on the increase rate. Therefore, the delay line circuit 14 is controlled so that each time the control signal d11_code ("4" to "10" in the example shown in FIG. 5) is input, the number of activated delay lines increases by "1", and the delayed signal d11_clk is generated accordingly. The delayed signal d11_clk generated by the delay line circuit 14 is re-inputted to the phase detection circuit 12 through the replica circuit 15 as the feedback signal fb_clk so that the phase difference of the phase signal up/down gradually converges to a specific range.

At time t4, the phase difference of the phase signal up/down converges to the specific range and eliminates delay. Therefore, the DLL control circuit 13 generates the control signal dl1_locked with the high level and provides the high-level control signal dl1_locked to the N-value detection circuit 20 to end the DLL locking operation and start the N-value detection operation.

When the N-value detection operation starts (that is, at time t4), the high-level control signal dl1_locked is input to the first one-shot circuit 211 of the n_clk signal generation circuit 21, and the low-level control signal dl1_reset_n is input to the second one-shot circuit 212. The output signals of the first one-shot circuit 211 and the second one-shot circuit 212 are input to the NOR circuit 214, and the output of the NOR circuit 214 is input to the flip-flop circuit 215. Except for the foregoing, the N-value detection operation is the same as the pre-N-value detection operation, so the detailed description is omitted. Then, until time t5, the N-value counting circuit 22 generates the N-value signal n_value that is counted up with the signal n_clk. In the example shown in FIG. 5, the N value of the N-value signal n_value is counted up to "4" and then output. The N-value detection circuit 20 outputs the generated N-value signal n_value to the delay counter 30.

In addition, in FIG. 5, the case where the N value is counted up to "4" and then output in the N-value detection operation (that is, N=4 is obtained by increasing the number of pre-delayed clock cycles (the pre-N value) detected in the pre-N-value detection operation by one) is take as example for illustration. However, in other embodiment, the case where the N value detected in the N-value detection operation can be equal to the pre-N value detection in the pre-N-value detection operation. In other words, the N-value detection circuit 20 can take the number of pre-delayed clock cycles (the pre-N value) detected in the pre-N-value detection operation or the value obtained by increasing the pre-N value by "1" as the number of delayed clock cycles (N-value).

In addition, during the period from time t4 to time t5 (that is, during the N-value detection operation), the N-value signal n_value output by the 4-bit counter 226 can be output to the delay counter 30 regularly, or it can be output to the delay counter 30 at time t5 (that is, the time point when the N-value detection operation ends). Since the delay counter 30 uses the N-value signal n_value to perform the delay counting after the specific period (tDLLK), if the correct N value can be obtained from the N-value detection circuit 20, the delay counter 30 can correctly perform the delay counting.

Next, the delay control procedure when the DLL circuit 10 performs the DLL locking operation in the fast mode will be described with reference to FIG. 6. Here, the steps or operations in the embodiment of FIG. 6 that are the same as the steps or operations of the DLL locking operation in the normal mode shown in FIG. 5 will be omitted. First, at timing t11, the reset signal RST is input to the DLL circuit 10, and the DLL circuit 10 enters the reset state. At the time t12, the N-value detection circuit 20 starts to perform the pre-N-value detection operation. At time t13, the N-value signal n_value detected by the N-value detection circuit 20 is "1". The N-value detection circuit 20 outputs the N-value signal n_value indicating "1" to the DLL control circuit 13 as the pre-N-value signal pre_n_value, and the pre-N-value detection operation ends at time t13.

From time t13, the delay control circuit performs the DLL locking operation. In the embodiment, the DLL control circuit 13 performs the DLL locking operation in the fast mode (also referred to as a fast locking operation herein) according to the received pre-N-value signal pre_n_value which indicates "1". In the fast locking operation, the DLL control circuit 13 increases the increase rate for the delay amount to transmit the control signal dl1_code, which sets the increased number of delayed line higher than that in the normal mode, to the delay line unit 14. In the embodiment, the case where the increase rate of the delay amount of the DLL locking operation in the normal mode is "1" and the increase rate of the delay amount of the fast locking operation is "4" is taken as an example. Accordingly, the delay line circuit 14 controls the number of activated delay lines to be increase by "4" each time the control signal dl1_code ("4" to "32" in the embodiment shown in FIG. 6) is input in the fast mode. In normal mode, if it is desired to increase the number of activated delay lines from "4" to "32", the control signal dl1_code needs to be input 28 times. However, in the fast mode of the embodiment, the control signal dl1_code is input only 7 times, and then the DLL locking operation ends. By performing the fast locking operation, the N-value detection sequence performed by the delay control circuit can be prevented from exceeding the specific period, so as to avoid misoperation.

Afterwards, at time t14, the N-value detection circuit 20 performs the N-value detection operation. In the embodiment, the N value detected by the N-value detection circuit 20 is "1". Next, at time t15, the N-value detection circuit 20 outputs the detected N value to the delay counter 30.

Thus, in the embodiment, when the pre-N value detected by the N-value detection circuit 20 is not greater than 1, the output pre-N-value signal pre_n_value will control the DLL control circuit 13 to perform the DLL locking operation in the fast mode. Compared with the locking operation in the normal mode, performing the fast locking operation takes less time. By preventing the DLL locking operation from extending beyond expectation in this way, it is possible to prevent the overall execution time of the N-value detection sequence from exceeding the specific period tDLLK. Thus, the DLL circuit 10 can smoothly perform the delay counting after the N-value detection sequence ends, so as to avoid misoperation.

Figure 7:
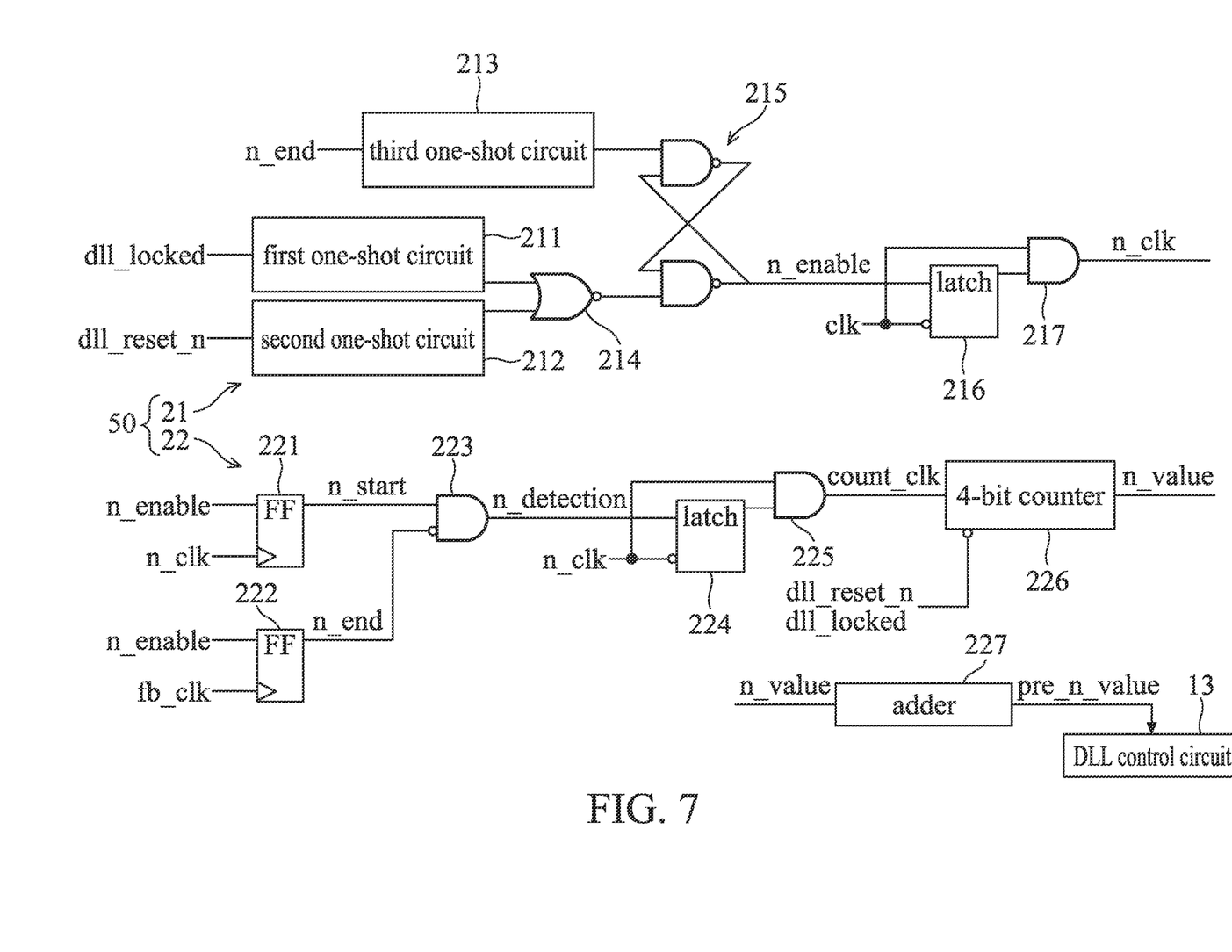
FIG. 7 is a schematic diagram showing a configuration example of an N-value detection circuit according to another embodiment of the present invention.

FIG. 7 shows a modified example of the N-value detection circuit 50. In the N-value detection circuit 50, the elements identical to those of the N-value detection circuit 20 shown in FIG. 4 are marked with the same symbols. In the N-value detection circuit 20 shown in FIG. 4, the 4-bit counter 226 generates the N-value signal n_value that is output to the delay counter 30 and also generates the N-value signal n_value that is output to the DLL control circuit 13 as the pre-N-value signal pre_n_value. In contrast, although the N-value detection circuit 50 shown in FIG. 7 outputs the N-value signal n_value generated by the 4-bit counter 226 to the delay counter 30 intact, the N-value detection circuit 50 further comprises an adder 227 that receives the N-valued signal n_value and generates the pre-N-valued signal pre_n_value output to the DLL control circuit 13.

As mentioned above, since the pre-N value is detected before the DLL locking operation, except in the case that the locking time Td11 is shorter, the pre-N value is generally less than the N value by 1. Therefore, in the modified example, by using the adder 227 to increase the N-valued signal n_value by 1, the generated pre-N-valued signal pre_n_value and the N-valued signal n_value are configured to have the same value. That is, in the modified example, the N-value detection circuit 50 is configured to detect a value that is obtained by increasing the value of the N-value signal n_value detected in the pre-N-value detection operation by one clock unit as the pre-N-value (the number of pre-delayed clock cycles).

Figure 8:
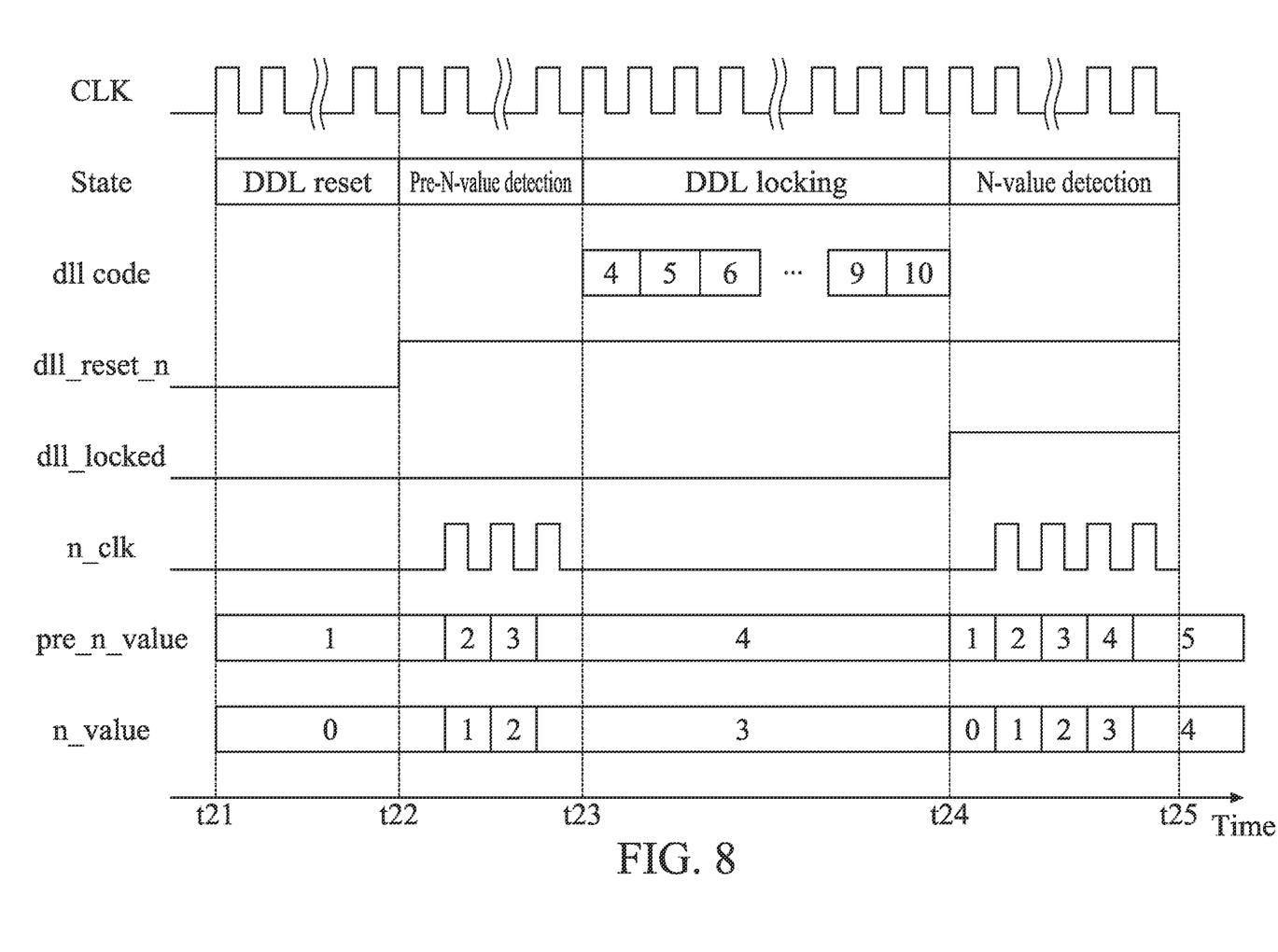
FIG. 8 is a timing diagram showing voltage transitions of related signals when a delay control circuit performs a locking operation in a normal mode according to another embodiment of the present invention.

The delay control method of the modified example will be described below by using the timing diagram shown in FIG. 8 in combination with FIGS. 1 and 7. FIG. 8 illustrates the delay control steps when the DLL circuit 10 performs the DLL locking operation in the normal mode. As shown in FIG. 8, the pre-N value detected in the pre-N-value detection operation is "4". Next, the N value detected in the N-value detection operation is also "4". Therefore, the pre-N-value signal pre_n_value and the N-value signal n_value can represent the same value. In addition, the present embodiment uses the adder 227 to add a specific value ("1" in the modified example) to the N value to obtain the pre-N value, however, the present invention is not limited thereto.

In addition, in the above-described embodiments, although the DLL control circuit 13 is configured to increase the increase rate of the delay amount in the fast mode, the DLL control circuit 13 may be configured to increase the decrease rate of the delay amount in the fast mode. That is to say, when the number of pre-delayed clock cycles (that is, the pre-N value) is not greater than a specific value (for example, 1), the DLL control circuit 13 can change the variation of the delay amount so that the decrease rate of the delay amount in the fast locking operation is higher than the decrease rate of the delay amount that is present when the number of pre-delayed clock cycles is greater than the specific value. For example, in the above-mentioned embodiment, the DLL control circuit 13 is configured to generate the control signal d11_code which causes the number of delay lines to gradually increase from "4". However, in a modified example, the number of delay lines can also be decreased from "32". For example, in the normal mode, each time the control signal d11_code is input, the number of activated delay lines is decreased by "1"; in the fast mode, each time the control signal d11_code is input, the number of activated delay lines is decreased by "4". By switching to the fast mode, the decrease rate of the delay amount is greater than that of the normal mode. The embodiment can prevent the N-value detection sequence executed by the delay control circuit from exceeding a specific period.

Figure 9A:
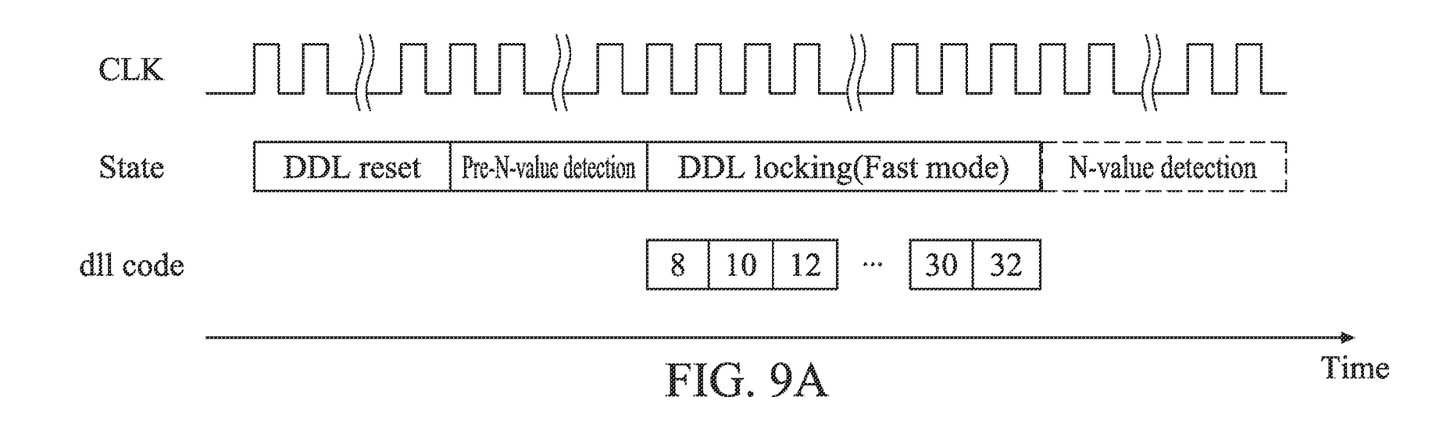
FIGS. 9A and 9B are timing diagrams showing transition of d11_code in a delay control circuit according to another embodiment of the present invention.

In addition, when the DLL locking operation is performed in the fast mode, the DLL control circuit 13 can also be configured to set the initially delay amount (that is, the number of delay lines activated immediately after the DLL locking operation) to be higher than that in the normal mode. For example, in the embodiment shown in FIG. 8, when the DLL control circuit 13 performs the DLL locking operation in the normal mode, the initially set delay amount (that is, the number of activated delay lines) is "4". As shown in FIG. 9A, when the DLL control circuit 13 performs the DLL locking operation in the fast mode, the initially set delay amount (that is, the number of activated delay lines) can be greater than "4" (for example, "8"), thereby preventing the N-value detection sequence performed by the delay control circuit from exceeding a specific period.

In addition, when the pre-N value detected in the pre-N-value detection operation is not greater than a specific value (for example, "1"), the N-value detection unit 20 may not perform the N-value detection operation after the DLL locking operation. In the embodiment, in order to detect the correct N value, as described in the above-mentioned embodiment, the N-value detection operation is performed after the DLL locking operation. However, in another embodiment, as shown in FIG. 9A, when the pre-N value is not greater than the specific value (that is, when the DLL locking operation is expected to be extended), the N-value detection operation after the DLL locking operation is not performed (the dotted lines are shown to indicate that the N-value detection operation can be omitted), and the N value is determined as "1". By omitting the N-value detection operation after the DLL locking operation, the execution time required for the N-value detection sequence can be further shortened.

Moreover, in the above-mentioned embodiment, the case where the pre-N value is "1" is taken as an example for illustration. However, the pre-N value can also be set to any value other than "1".

In addition, the DLL control circuit 13 may store a plurality of specific values (such as a first specific value and a second specific value), and different variation rates for the delay amount are set in response to these specific values. For example, when the specific value is smaller, the variation rate of the delay amount is higher. For example, when the first specific value is "1" and the second specific value is "2", the DLL control circuit 13 is configured to perform a first fast mode with an increase rate of "4" when the pre-N value is equal to or below 1 and perform a second fast mode with an increase rate of "2" when the pre-N value is 2. That is, the pre-N value is compared with different specific values to determine which fast mode to be performed. In other words, when the number of pre-delayed clock cycles is less, the variation rate of the delay amount is higher. When the number of pre-delayed clock cycles is less, the DLL locking operation (that is, the delay operation) can end earlier. In this way, an appropriate one of the fast modes can be selected according to the pre-N value, so as to control the execution time of the N-value detection sequence more precisely.

Figure 9B:
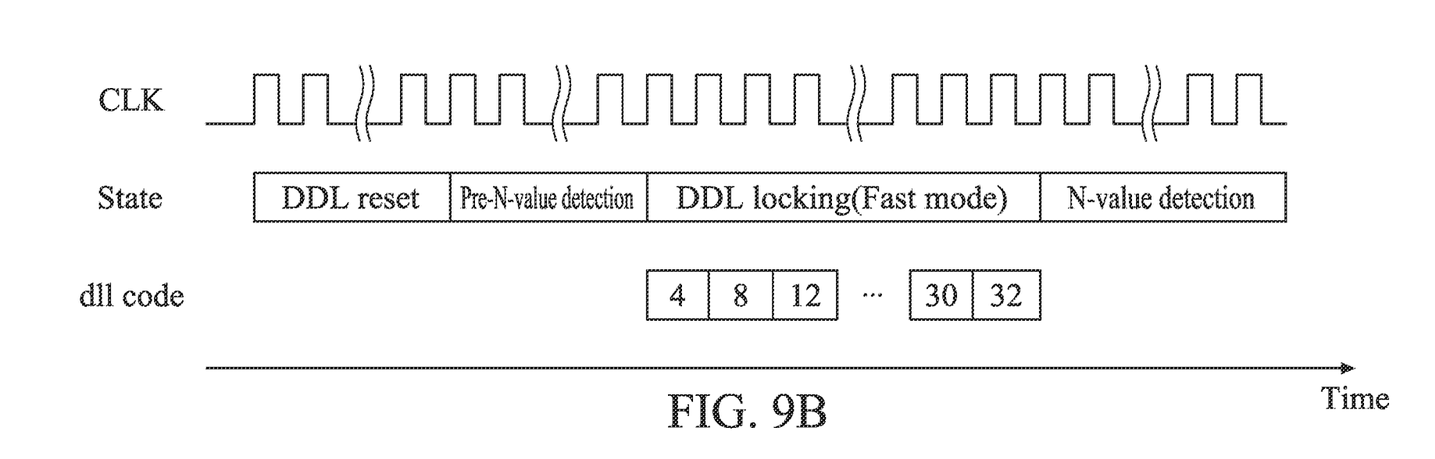

In addition, in the above-mentioned embodiment, the case where the variation rate of the delay amount is not changed during the DLL locking operation in the fast mode is described as an example, however, the present invention is not limited thereto. In other embodiment, the DLL control circuit 13 may also be configured to change the variation rate in the DLL locking operation. For example, the DLL control circuit 13 may change the increase rate of the delay during the fast mode. At this time, as shown in FIG. 9B, the increase rate of the delay amount is set to "4" at the start of the DLL locking operation, and the increase rate is changed to "2" after a specific time (such as, the time w % ben the phase difference between the input clock signal and the feedback signal becomes lower than a specific value). In this way, by dynamically changing the increase rate (the variation rate), the DLL locking operation can be ended early and surely.

Therefore, the present disclosure provides a green technology by reducing operation time and power consumption of the DRAM. Besides, even in the case of environmental changes, the delay control circuit of the present invention can still operate normally and has high stability, so as to be suitable for being applied in field of electric vehicles.

In addition, in the embodiment, the case where the increase rate of the delay amount is "4" when the value of the pre-N-value is not greater than "1" is described as an example, however, the present invention is not limited thereto. The variation rate for the delay amount can be set arbitrarily. For example, the increase rate (the variation rate) that is present when the value of the pre-N value is not greater than "1" may be at least twice (for example, 2 times or 4 times) the increase rate that is present when the pre-N value is greater than 1. In this way, the DLL locking operation can be ended early.

In addition, in the above-mentioned embodiment, the semiconductor memory device is a DRAM, for example, DDR3, however, the present invention is not limited thereto. For example, the semiconductor memory device may also be a static random access memory (SRAM), a flash memory, or another semiconductor memory device.

The embodiments and modifications described above are described to facilitate the understanding of the present invention, but the present invention is not limited thereto. Therefore, the elements disclosed in the above embodiments and modifications include all design changes or equivalents within the technical scope of the present invention.

The configuration of the DLL circuit 10 in the above-mentioned embodiment is merely an example. The configuration of the DLL circuit 10 can be changed appropriately, and various other configurations can also be adopted. In addition, the configurations of the N-value detection circuits 20 and 50 are shown in FIG. 4 and FIG. 7, however, the above-mentioned configurations are merely examples. The configurations of the N-value detection circuits 20 and 50 can be appropriately changed, and various other configurations can also be adopted.

Besides, the semiconductor memory devices of the present disclosure may be used on automotive electronics, such as Advanced Driver Assistance Systems (ADAS), Instrument Clusters, Infotainment. The semiconductor memory devices of the present disclosure may be used on Industrial applications, such as aerospace, medical, safety equipment, health & fitness, industrial controls, instrumentation, security, transportation, telecommunications, PoS machines, human machine interface, programmable logic controller, smart meter, and industrial networking. The semiconductor memory devices of the present disclosure may be used on communication and networking devices such as STB, switches, routers, passive optical networks, xDSL, wireless access point, cable modem, power line communications M2M, mobile phones, base stations, DECT phones, and many other new communication products. The semiconductor memory devices of the present disclosure may be used on desktops, notebooks, servers, gaming notebooks, ultra-books, tablets, convertibles, HDD, and SSD. The semiconductor memory devices of the present disclosure may be used on space constrained applications including Wearable. MP3 players, smart watches, games, digital radio, toys, cameras, digital photo album, GPS, Bluetooth and WiFi modules. The semiconductor memory devices of the present disclosure may be used on television, display and home electronics.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A delay control circuit for generating a delayed signal as an output clock signal according to an input clock signal, the delay control circuit comprising:

an N-value detection circuit receiving the input clock signal and the output clock signal and configured to perform a pre-N-value detection operation, wherein the pre-N-value detection operation comprises detecting the number of delayed clock cycles from the input clock signal to the output clock signal as the number of pre-delayed clock cycles before a delay operation is performed;

a DLL control circuit configured to set a delay amount according to a phase difference between the input clock signal and the output clock signal and the number of pre-delayed clock cycles and output a control signal representing the delay amount; and a delay line circuit configured to receive the control signal and perform the delay operation according to the control signal, wherein the delay operation comprises delaying the input clock signal based on the delay amount and generating the output clock signal so that the input clock signal and the output clock signal are synchronous, wherein in response to that the number of pre-delayed clock cycles is not greater than a specific value, the DLL control circuit is configured to change the delay amount so that the delay line circuit performs the delay operation in a fast mode, wherein in response to that the number of pre-delayed clock cycles is greater than the specific value, the delay line circuit performs the delay operation in a normal mode, and wherein the delay amount for the normal mode is different from the delay amount for the fast mode.

2. The delay control circuit as claimed in claim 1, wherein a variation rate for the delay amount in the fast mode is greater than the variation rate for the delay amount in the normal mode.

3. The delay control circuit as claimed in claim 1, wherein the N-value detection circuit is further configured to perform an N-value detection operation, and the N-value detection operation comprises detecting the number of delayed clock cycles from the input clock signal to the output clock signal after the delay operation.

4. The delay control circuit as claimed in claim 1, wherein in response to that the number of pre-delayed clock cycles is not greater than the specific value, the DLL control circuit is configured to control an increase rate for the delay amount in the fast mode to be greater than the increase rate for the delay amount in the normal mode.

5. The delay control circuit as claimed in claim 2, wherein the DLL control circuit is configured to store a plurality of different specific values, the plurality of specific values comprises a first specific value and a second specific value, the first specific value is less than the second specific value, and the DLL control circuit is configured to set the variation rate for the delay amount in the fast mode based on a comparison result between the number of pre-delayed clock cycles and the first specific value or the second specific value.

6. The delay control circuit as claimed in claim 5, wherein:

in response to that the pre-delay clock cycle number is not greater than the first specific value, the DLL control circuit is configured to set the variation rate for the delay amount in the fast mode as a first variation rate so that the delay line circuit performs the delay operation in a first fast mode, and in response to that the number of pre-delayed clock cycles is greater than the first specific value and not greater than the second specific value, the DLL control circuit is configured to set the variation rate for the delay amount in the fast mode as a second variation rate so that the delay line circuit perform the delay operation in a second fast mode, and the second variation rate is less than the first variation rate.

7. The delay control circuit as claimed in claim 3, wherein in response to that the number of pre-delayed clock cycles is not greater than the specific value, the N-value detection circuit does not perform the N-value detection operation.

8. The delay control circuit as claimed in claim 1, further comprising:
a delay counter,
wherein the N-value detection circuit is configured to output the number of the pre-delayed clock cycles detected in the pre-N-value detection operation or output a value that is obtained by increasing the number of pre-delayed clock cycles detected in the pre-N-value detection operation by one clock unit to the delay counter as the number of delayed clock cycles.

9. The delay control circuit as claimed in claim 1, further comprising:
a replica circuit coupled to an output of the delay line circuit and an input of the N-value detection circuit and configured to generate a feedback signal according to the output clock signal and provide the feedback signal to the N-value detection circuit;
a phase detection circuit coupled to an input of the DLL control circuit and configured to generate a phase signal according to the feedback signal and the input clock signal and provide the phase signal to the DLL control circuit; and
a multiplexer receiving the input clock signal and a signal that corresponds to the input clock signal and is generated by the N-value detection circuit, selecting the input clock signal or the signal that corresponds to the input clock signal and is generated by the N-value detection circuit according to a first control signal generated by the N-value detection circuit as an output, and providing the output to the delay line circuit.

10. The delay control circuit as claimed in claim 9, wherein the N-value detection circuit comprises:
a N-value counting circuit configured to generate an N-value signal representing the number of pre-delayed clock cycles or the number of delayed clock cycles and generate an ending signal; and
a signal generation circuit configured to generate the first control signal and the signal that corresponds to the input clock signal according to the ending signal and a second control signal from the DLL control circuit.

11. The delay control circuit as claimed in claim 10, wherein the N-value detection circuit further comprises:
an adder configured to receive the N-value signal and perform an addition operation on the N-value signal, wherein a result of the addition operation is used to represent the number of pre-delayed clock cycles and output to the DLL control circuit.

12. The delay control circuit as claimed in claim 2, wherein in response to that the number of pre-delayed clock cycles is not greater than the specific value, the DLL control circuit changes the variation for the delay amount in the fast mode during the delay operation.

13. The delay control circuit as claimed in claim 1, wherein the DLL control circuit is configured to initially set the delay amount to be greater than the delay amount in the normal mode when the delay operation is performed in the fast mode.

14. A semiconductor memory device comprising:
the delay control circuit as claimed in claim 1;
a memory cell array;
an input buffer configured to provide the input clock signal; and
an output buffer coupled to an output of the delay line circuit.

15. The semiconductor memory device as claimed in claim 14, wherein the semiconductor memory device is a dynamic random access memory.

16. A delay control method comprising:
performing a pre-N-value detection operation, wherein the pre-N-value detection operation comprises detecting the number of delayed clock cycles from the input clock signal to the output clock signal as the number of pre-delayed clock cycles before a delay operation is performed;
by a DLL control circuit, setting a delay amount according to a phase difference between the input clock signal and the output clock signal and the number of pre-delayed clock cycles and outputting a control signal representing the delay amount; and
by a delay line circuit, performing the delay operation according to the control signal, wherein the delay operation comprises delaying the input clock signal based on the delay amount and generating the output clock signal so that the input clock signal and the output clock signal are synchronous,
wherein in response to that the number of pre-delayed clock cycles is not greater than a specific value, the delay amount is changed so that the delay line circuit performs the delay operation in a fast mode,
wherein in response to that the number of pre-delayed clock cycles is greater than the specific value, the delay line circuit performs the delay operation in a normal mode, and
wherein the delay amount for the normal mode is different from the delay amount for the fast mode.

17. The delay control method as claimed in claim 16, wherein a variation rate for the delay amount in the fast mode is greater than the variation rate for the delay amount in the normal mode.

18. The delay control method as claimed in claim 16, further comprising:
performing an N-value detection operation, wherein the N-value detection operation comprises detecting the number of delayed clock cycles from the input clock signal to the output clock signal after the delay operation.

19. The delay control method as claimed in claim 16, wherein in response to that the number of pre-delayed clock cycles is not greater than the specific value, an increase rate for the delay amount in the fast mode is controlled to be greater than the increase rate for the delay amount in the normal mode through the DLL control circuit.

20. The delay control method as claimed in claim 17, further comprising:
storing a plurality of different specific values,
wherein the plurality of specific values comprises a first specific value and a second specific value, and the first specific value is less than the second specific value, and
wherein the variation rate for the delay amount in the fast mode is set based on a comparison result between the number of pre-delayed clock cycles and the first specific value or the second specific value.

* * * * *